(12) United States Patent
Jones

(10) Patent No.: US 7,870,160 B2
(45) Date of Patent: Jan. 11, 2011

(54) BLOCK COMPRESSION ALGORITHM

(75) Inventor: Paul Jones, Veenendaal (NL)

(73) Assignee: Objectif Lune Inc., Quebec (CA)

( * ) Notice: Subject to any disclaimer, the term of this patent is extended or adjusted under 35 U.S.C. 154(b) by 375 days.

(21) Appl. No.: 12/081,316

(22) Filed: Apr. 14, 2008

(65) Prior Publication Data

US 2009/0259645 A1 Oct. 15, 2009

(51) Int. Cl.
G06F 7/00 (2006.01)
H03M 7/00 (2006.01)

(52) U.S. Cl. .................... 707/795; 341/106
(58) Field of Classification Search ........... 707/795; 358/1.16; 341/106, 51, 63; 711/206
See application file for complete search history.

(56) References Cited

U.S. PATENT DOCUMENTS

| | | | |
|---|---|---|---|
| 4,626,829 A * | 12/1986 | Hauck ........................ 341/63 |
| 5,473,326 A | 12/1995 | Harrington et al. |
| 5,490,260 A | 2/1996 | Miller et al. |
| 5,627,995 A | 5/1997 | Miller et al. |
| 5,805,303 A | 9/1998 | Imaizumi et al. |
| 5,864,859 A | 1/1999 | Franaszek |
| 5,867,114 A | 2/1999 | Barbir |
| 6,141,742 A | 10/2000 | Favor |
| 6,253,264 B1 | 6/2001 | Sebastian |
| 6,269,464 B1 | 7/2001 | Boussina et al. |
| 6,298,321 B1 | 10/2001 | Karlov et al. |
| 6,446,188 B1 * | 9/2002 | Henderson et al. ......... 711/206 |
| 6,529,633 B1 | 3/2003 | Easwar et al. |
| 6,747,582 B2 * | 6/2004 | Morihara et al. ............ 341/106 |
| 6,857,047 B2 | 2/2005 | Basu et al. |
| 6,906,645 B2 | 6/2005 | Jones et al. |
| 6,944,347 B2 | 9/2005 | Lee et al. |
| 7,039,769 B2 | 5/2006 | Castelli et al. |
| 7,103,608 B1 * | 9/2006 | Ozbutun et al. ............. 707/604 |
| 7,142,721 B2 | 11/2006 | Chen et al. |
| 7,167,593 B2 | 1/2007 | Singh |
| 7,190,284 B1 * | 3/2007 | Dye et al. ..................... 341/51 |
| 2001/0051941 A1 | 12/2001 | Tonomura |
| 2002/0085764 A1 | 7/2002 | Brady |
| 2003/0034905 A1 | 2/2003 | Anton et al. |
| 2003/0229761 A1 | 12/2003 | Basu et al. |
| 2005/0262479 A1 | 11/2005 | Ageyev et al. |
| 2006/0112264 A1 | 5/2006 | Agarwal |
| 2007/0002780 A1 * | 1/2007 | Pessi ........................ 370/261 |

* cited by examiner

*Primary Examiner*—Hung T Vy
(74) *Attorney, Agent, or Firm*—McDermott Will & Emery LLP

(57) ABSTRACT

A method for compressing a data stream based on a 3 byte sequence is used. Each three byte sequence is assigned a code word including a location and a length of the data associated with the code word. When a 6 byte sequence is located, a binary tree of 6 byte sequences sharing the same first three bytes is built, associating each 6 byte sequence with a position in the stream where the 6 byte sequence is found. When the length of a code word is changed, a byte sequence is emitted that identifies the code word to be changed and updating the length of the code word, so that when a match is found, a byte sequence is emitted that identifies the code word associated with the matched data. The method finds particular application in data streams that are sent to printers, and which contain large blocks of identical data.

4 Claims, 8 Drawing Sheets

BLOCK COMPRESSION ALGORITHM

FIELD OF THE INVENTION

The present invention relates to a block compression algorithm.

BACKGROUND OF THE INVENTION

A dictionary coder, also sometimes known as a substitution coder, is any of a number of lossless data compression algorithms which operate by searching for matches between the text to be compressed and a set of strings contained in a data structure (called the 'dictionary') maintained by the encoder. When the encoder finds such a match, it substitutes a reference to the string's position in the data structure. Commonly used algorithms such as LZ77/78, LZW, LZO, DEFLATE, LZMA and LZX are geared towards finding small repetitions in the data that is to be compressed.

The problem with the aforementioned dictionary coders is that they build a dictionary of sequences of bytes processed, where each such sequence is assigned a codeword. Generally there is an upper limit on the number of code words that can be used. When all code words have been assigned to sequences of bytes the algorithm must decide how to proceed when it wants to add a new sequence to the dictionary. In many cases the algorithm will simply reset the mapping of code words to sequences of bytes and restarts the compression process of the rest of the data as if the first part of the data had never been processed. This situation is triggered when there is a sufficiently large sequence of bytes with very little repetition of data.

When trying to compress a print stream using one of the aforementioned dictionary coders one may find that the dictionary coder resets quite often. Typically this occurs when there are large amounts of image and font data included in the print stream. Each time the dictionary coder processes some image data it will run out of code words and perform a reset. This causes the dictionary coder to forget any sequences it has seen before the image data which may actually repeat itself after the image data. More importantly it also forgets the sequences found in the image data. The next time the dictionary coder hits an image (even if the image was an exact copy of the previous image encountered) it is treated by the dictionary coder as new data resulting in very little compression of the print stream.

Unfortunately many print streams actually contain large amounts of repeated data as each page of the print stream is generated from a template (either manually or automatically) that include similar text (such as address info, salutation, etc.) and imagery (such as logos or signatures). For instance in a direct mail application each page of the print stream may be a letter to a potential customer. Typically such letters are generated from a template where the only variable parts are the address and the salutation. Therefore the main text and imagery (logos, signatures, product photos, etc.) are often exactly the same for every recipient. Each page in the print stream will therefore have a large amount of text and image data encoded that is exactly the same on each page. It should therefore be possible and advantageous to compress such files considerably.

It is not uncommon that a print stream contains the print data for thousands of recipients. Storing such files on hard disk before sending them to the printer may therefore require large amounts of storage (without compression). Transferring such a print stream via a network to the printer may also take quite a while depending on the available network bandwidth. Although it is not uncommon for (internal) networks to use 100 Mbit or 1 Gbit connections, the network connections between multiple geographically separated locations have bandwidth limits imposed on them for cost reasons. Compressing the print stream may therefore be the only viable solution to transferring files across a bandwidth limited network in a reasonable time frame and at a reasonable cost.

SUMMARY OF THE INVENTION

Thus, the present invention provides a method for compressing a data stream containing large blocks of identical data, as well as the compressed stream of data itself.

In accordance with one aspect of the invention, there is provided a computer-implemented method for encoding a data stream, said method comprising the steps of:

(a) receiving said data stream;

(b) providing a 6 byte window for said data stream;

(c) examining the first three bytes of said window;

(d) determining if the first three bytes of said window has a corresponding entry in a lookup table;

(e) storing a position in the data stream of the first three bytes of said window in the lookup table if the lookup table does not include an entry corresponding to the first three bytes of said window;

(f) if the lookup table includes an entry corresponding to the first three bytes of said window, modifying the entry to include a binary tree of 6 byte sequences each beginning with the same three bytes and associating each 6 byte sequence included in the binary tree with a respective position in the data stream where the 6 byte sequence was found;

(g) if the lookup table already contains a binary tree of 6 byte sequences, determining if a 6 byte sequence currently in the window is present in the binary tree contained in the lookup table;

(h) if the 6 byte sequence currently in the window is not present in the binary tree contained in the lookup table, modifying the binary tree contained in the lookup table to associate the 6 byte sequence currently in the window with a current position in the data stream;

(i) if the 6 byte sequence currently in the window is present in the binary tree contained in the lookup table, determining a length of a matching portion by reading first data from a first location in the data stream at which the 6 byte sequence currently in the window was found and comparing the first data with second data following the 6 bytes currently in the window, and storing the length of the matching portion in the tree and assigning a codeword to the sequence of bytes in the matching portion;

(j) if the 6 byte sequence currently in the window already has an associated length and the length of the matching portion is greater than zero and less than the associated length, the length of a codeword assigned to the 6 byte sequence currently in the window is shortened in accordance with the length of the matching portion;

(h) continuing processing at a location in the data stream of a next non-matching byte until the data stream has been fully processed, wherein the method is performed by a computer programmed to perform steps (a)-(h). In accordance with another aspect of the invention, there is provided a computer-implemented method for compressing a data stream based on three byte sequences, the method comprising: assigning each three byte sequence a codeword with a location and a length of a data associated with the codeword; and when a three byte sequence is located in the data stream, building a binary tree of 6 byte sequences each beginning with the same three bytes, associating each 6 byte sequence with a position in the data stream where the 6 byte sequence is found, so that when the length of a codeword word is changed, a byte sequence is emitted that identifies the code word being changed and the length of the codeword is updated, so that when a match is found, a byte sequence is emitted that identifies a codeword associated with the matched data, wherein the method is performed by a computer programmed to perform the method.

BRIEF DESCRIPTION OF THE DRAWINGS

The present invention will be better understood after having read a description of a preferred embodiment thereof, made in reference to the following drawings in which.

DESCRIPTION OF A PREFERRED EMBODIMENT OF THE INVENTION

Compression

Figure 1:
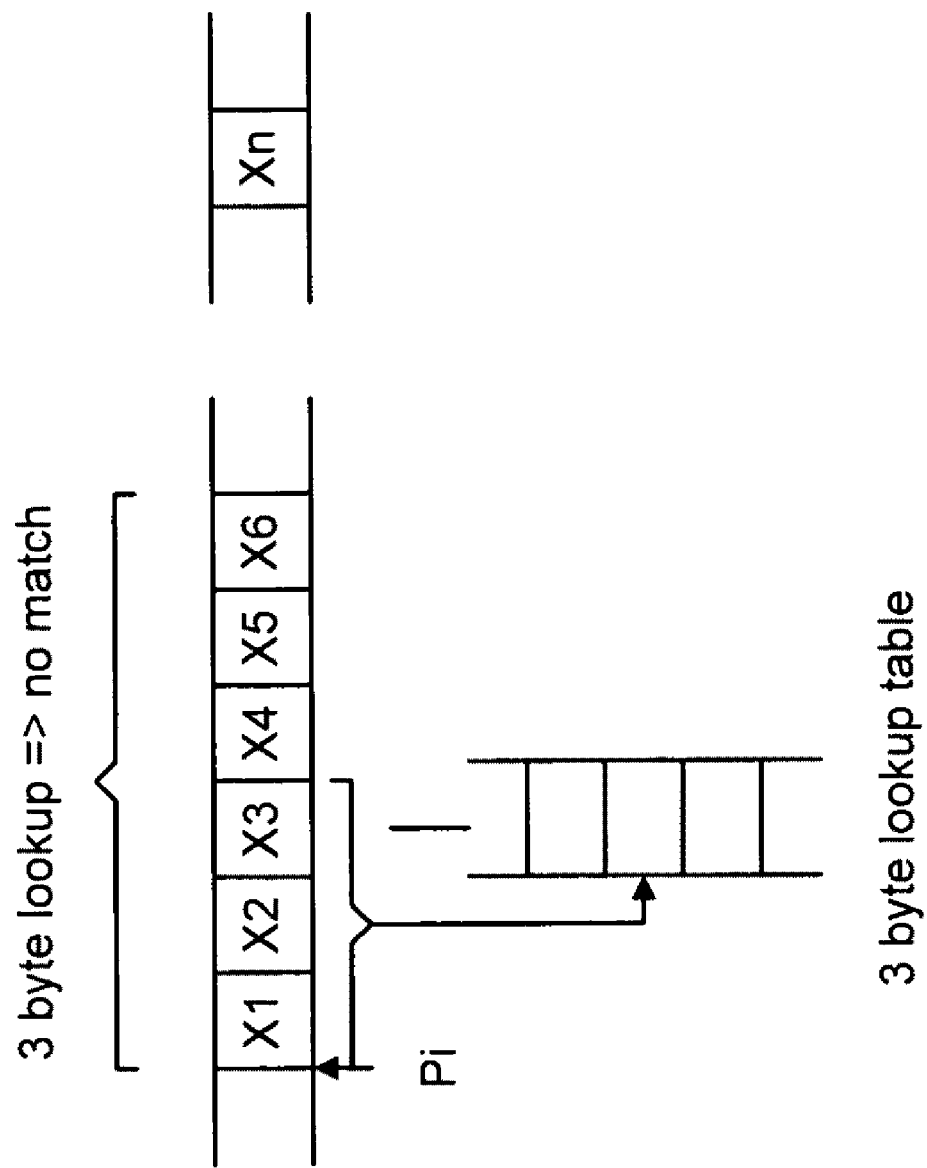
FIG. 1 shows the three byte lookup table in a data stream with no match.

The present invention concerns a compression scheme that allows the compression of print streams (but is not limited in application to print streams). This algorithm uses the fact that any given sequence of 3 bytes has a statistically low probability (1 in 16 million) of occurring in random data and that any sequence of 6 bytes has an even lower probability (1 in 281 trillion) of occurring in random data. The print stream is processed byte for byte using 6 bytes of look ahead. The first 3 bytes of look ahead are used to lookup whether this sequence of 3 bytes has been seen before (see FIG. 1):

If this sequence of 3 bytes has never been seen before, the position in the file of this sequence is stored in the lookup table.

Figure 2:
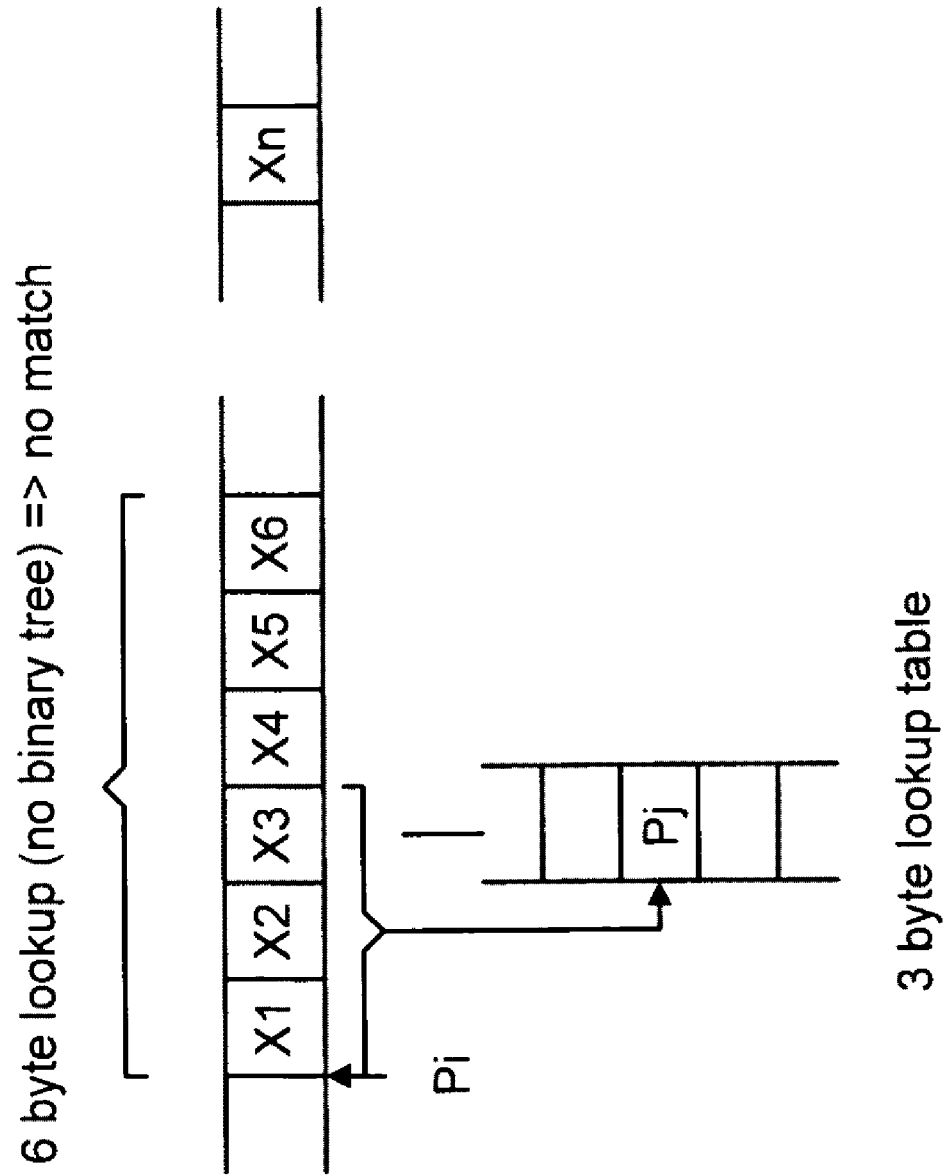
FIG. 2 shows the 6 byte lookup table without a binary tree and no match.

If the lookup table already contains a position for this 3 byte sequence then the entry in the lookup table is modified to include a binary tree of 6 byte sequences that share the same first 3 bytes (see FIG. 2). In this case the algorithm must read 3 bytes of data from the first location at which it encountered the 3 byte sequence. Each 6 byte sequence is associated with a position within the file where that 6 byte sequence was first found.

Figure 3:
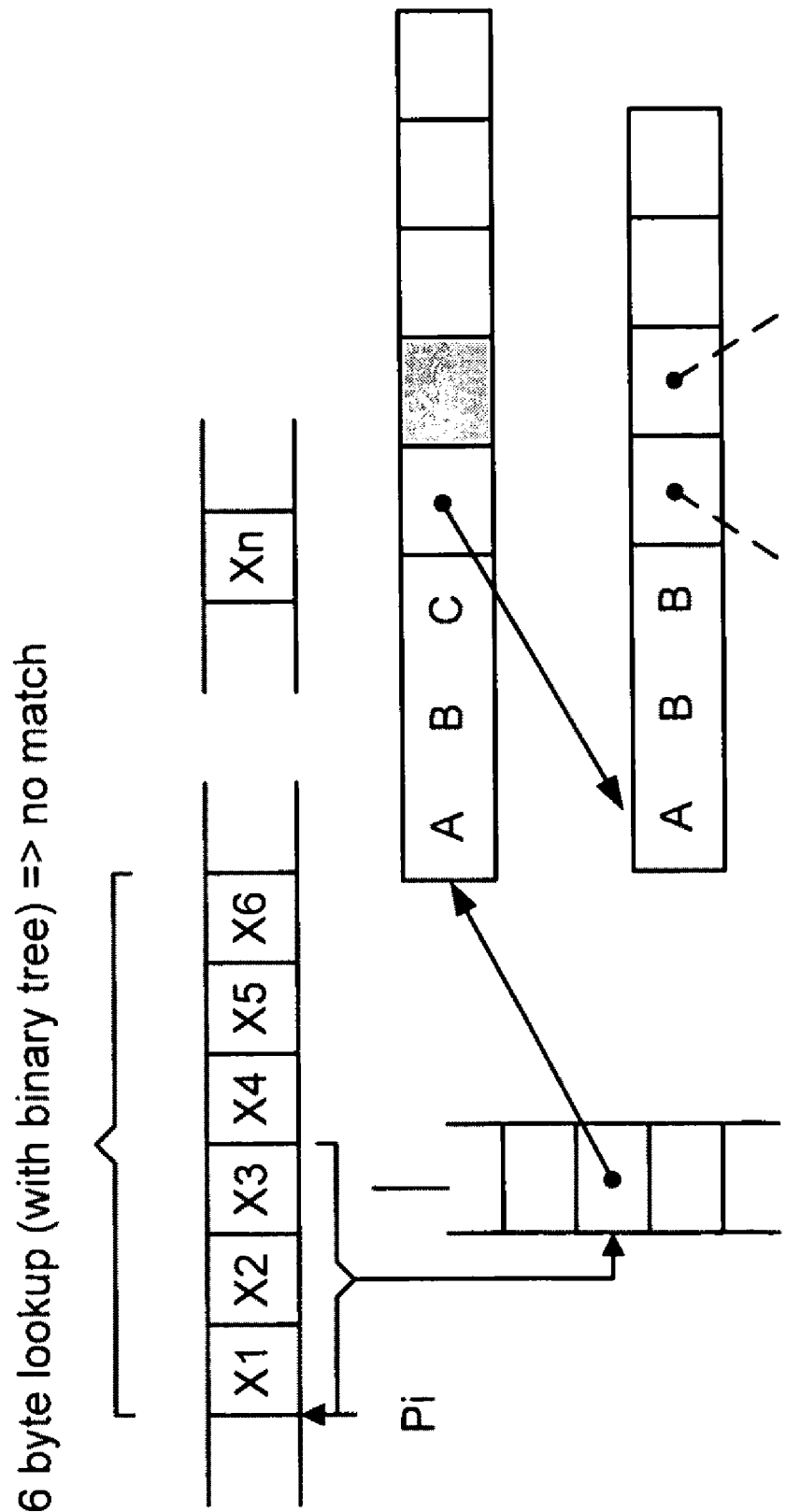
FIG. 3 shows the 6 byte lookup table with a binary tree but no match.
Figure 4:
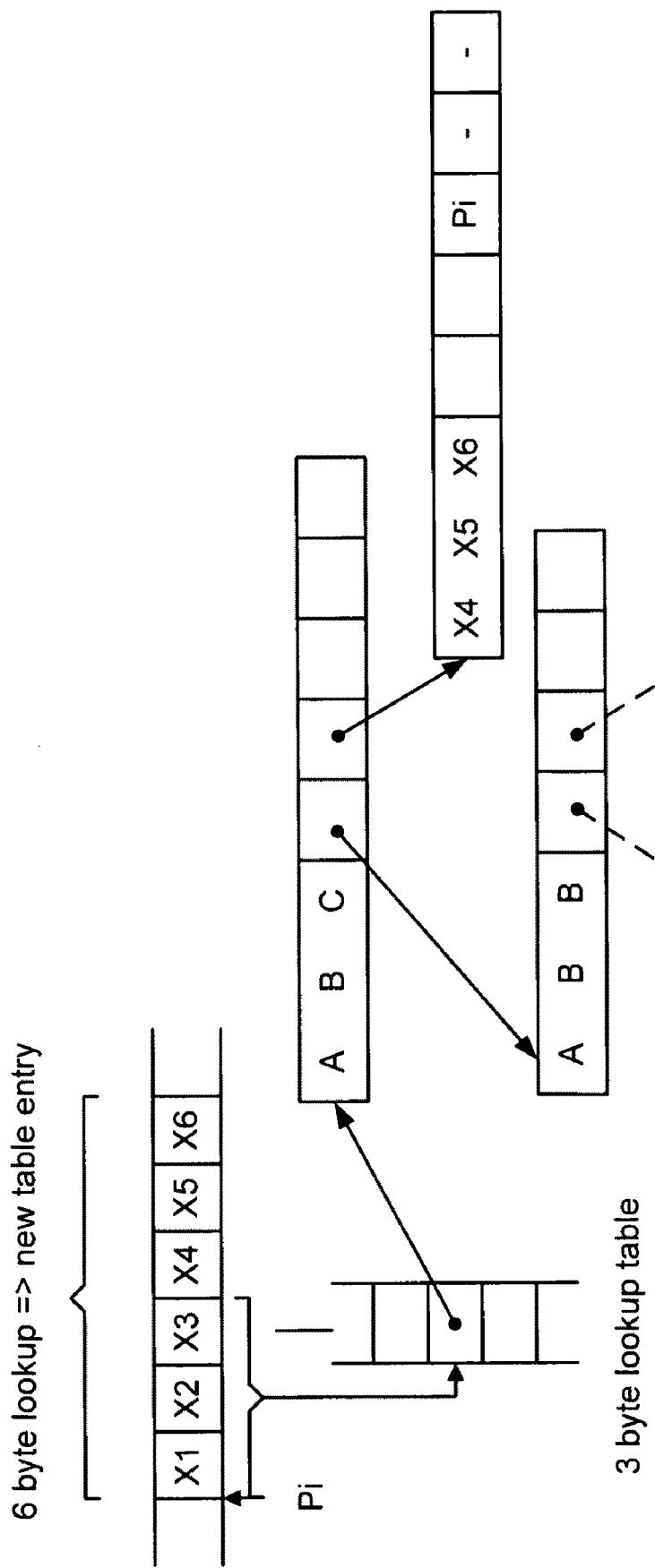
FIG. 4 shows the 6 byte lookup table for a new entry.

If the lookup table already contains a binary tree of 6 bytes sequences, the tree is searched to see if the current 6 bytes of look ahead is already present (see FIG. 3). If the 6 byte sequence is not present an entry is made in the binary tree associating the 6 byte sequence with the current position in the print stream (see FIG. 4).

Figure 5:
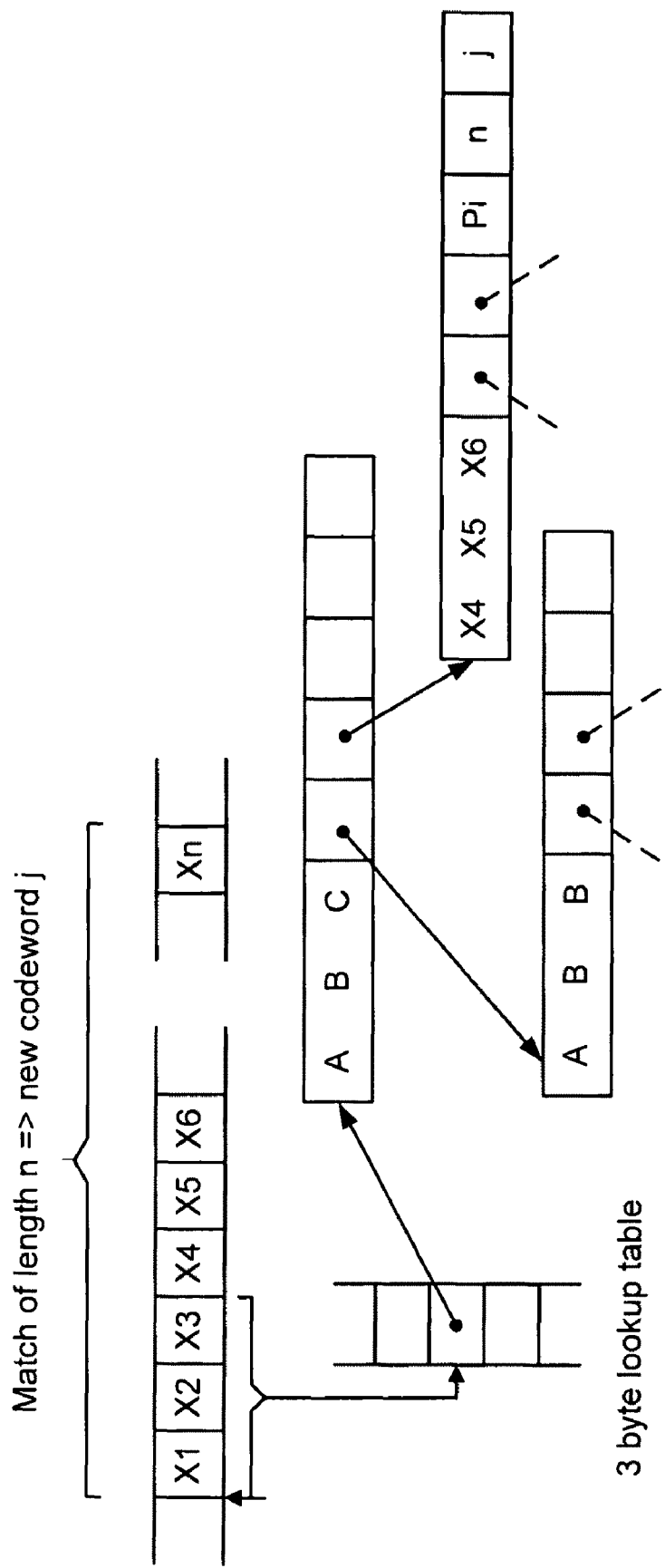
FIG. 5 shows the match of length n giving a new codeword j

If the 6 bytes of look ahead represent a 6 byte sequence that has already been processed by the compression algorithm, the following matching process starts:

If this is the second time that the 6 byte sequence is found the algorithm must determine the length of the match. It does this by reading data from the first location at which the 6 byte sequence was found and comparing it with the data that follows the current 6 byte look ahead. The length of the matching portion of data is then stored in the tree and a code word is assigned to the sequence of matching data. Processing then continues at the location of the first non-matching byte (see FIG. 5).

If this 6 byte sequence already has a length associated with it, the matching process proceeds by matching data from the first location this sequence was found up to the given length with the data that follow the current 6 byte lookahead. If a partial match is found, the length of the codeword assigned to the 6 byte sequence is shortened to the length of the partial match. Processing continues at the location of the first non-matching byte.

The above process assigns code words to every sequence of repeating data in the print stream with a length of 6 or more. Each code word is associated with a unique 6 byte start sequence and the location and length of the sequence of repeating data.

Figure 6:
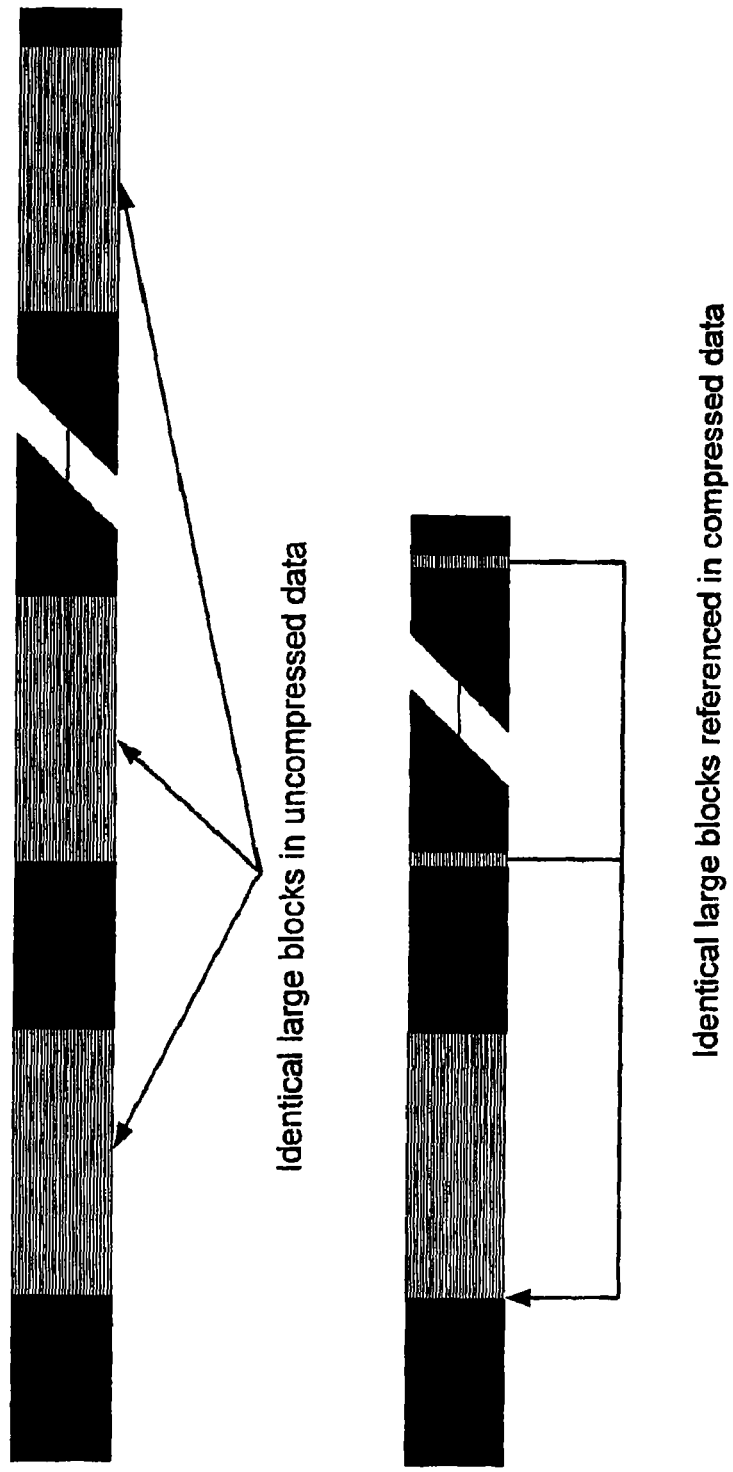
FIG. 6 shows the original data stream with identical large blocks of data and the same data stream with identical large blocks referenced in compressed data.

The compressed print stream is generated "on the fly" and consists of blocks of data interspersed with code word definition and usage sequences (see FIG. 6). Whenever a new code word is assigned, a byte sequence is emitted that identifies the location and length of the data assigned to the code word. Whenever the length of a code words length is changed a byte sequence is emitted that identifies which code word is to be changed and it's new length. Whenever a match is found a byte sequence is emitted that identifies the code word associated with the matched data. To simplify encoding of these byte sequences, length bytes are used to identify the length of the other blocks of data (see FIG. 2).

Further compression of the output can be achieved by passing the blocks of unmatched data to a dictionary coder. The dictionary coder will find small repetitions and will not be disturbed by the large sequences of repeating data (as these were filtered out of the data passed to the dictionary coder), thereby reducing the number of resets.

Decompression

Decompression of data compressed the above algorithm proceeds as follows:

If a block of data is encountered the encoded length is used to determine how many bytes must be sent to the dictionary coder for decompression. The decoded data is then appended to the output If a code word definition sequence (see FIG. 6) is found, the next available code word is assigned to the decoded length and location of the data to be assigned to the code word.

The data assigned to the code word is read and appended to the output. As this point this data may be added to a cache to reduce (disk) read operations.

If a code word modification sequence is found, the code word is decoded and the length for that code word is updated (the parts of the data no longer associated to the code word may now be purged from the cache). The (cached) data now assigned to that codeword is then appended to the output.

If a code word match sequence is found, the code word is decoded and the (cached) data for that code word is then appended to the output.

Compressing Across Multiple Print Streams

The block compression algorithm can be easily modified to allow the code words and their associated data to be persistent. This may be advantageous when in stead of sending one large print stream; many smaller print streams are used. This may occur in distributed printing, where documents are printed on demand at the point of sale. Examples of such documents are statements, bills and rental agreements. As each document is build from a template, each of the generated print streams will contain the same sequences of data. This may also be advantageous for print streams generated from non-templated documents that adhere to a corporate house style, as these documents are often required to contain certain imagery (such as logo's and signatures) and text (such as company address info, disclaimers, salutations). The device setup code included in each print stream will also often be the same and can therefore be compressed.

The compressing and decompressing system can work together such that they each store the repeating sequences of data and agree upon a code word for each such sequence.

The compressing system can incorporate cached sequences of data into its lookup tables by:
  reading the first 6 bytes of each cached sequence of data;
  using the first 3 bytes of that data to locate in which entry to create a binary tree of 6 byte entries.
  adding the 6 byte sequence into the appropriate binary tree and associating the length and location of the cached data with that 6 byte sequence and assigning a code word to it.

If the compressing and decompressing system process each cached entry in a predefined order (for instance sorted by the unique 6 byte sequence associated with the cached data) they will assign the same code words to the same data. As long as both systems maintain the same set of cached items, the code words can be safely used in compression and decompression.

A bi-directional communication protocol between compressing and decompressing system can be used to ensure that the set of cached items is the same on both systems.

One method would be for the compressing and decompressing systems to maintain a MD5 checksum over all the cached data (processed in the predefined order used to assign code words). Using the MD5 checksum the systems can quickly establish whether they have the same set of cached items. If a difference is detected, the compressing system could send the decompressing system the correct set of cached items, before proceeding with sending the compressed print stream.

Printer Centric Compression and Decompression

Some page description languages (or print technologies) have the capability to store and recall partial page descriptions. Examples are PCL (which support macros) and PostScript (which supports forms and reusable object streams). These capabilities can be used to implement the decompression step of the block compression algorithm without the need of a separate decompression system. Some printers have capabilities to run user-defined programs on their systems using various API's such as MEAP (for Canon devices), SDK/J (for Ricoh devices), CHAI (for HP devices), etc. These technologies could also be used to allow printer-centric decompression.

For PDL based decompression to work the original print stream must be in a page description language (PDL) that supports printer based decompression (such as PCL or PostScript). The block compression algorithm must be slightly modified to:
  ensure that it only caches sequences of data that can be converted into a partial page description in the PDL. For PCL this means that an escape sequence must be treated as an atomic unit by the compression algorithm and must either be completely included in a cached item or completely left out. For PostScript it means that caching must occur at token boundaries (see the PostScript Language Reference Manual for the definition of a token).
  modify the output of the compression algorithm to use the necessary PDL commands to store or recall a cached item.

Controlling the Sequence that May be Cached

The input processing stage of the block compression algorithm can be modified to allow a filter to determine at which locations a block may start or end. Only at these locations the block compression algorithm should process the 3 and 6 byte sequences to find matching data. In the matching phase the same filter can be used to modify the length of the found match before it is stored to ensure that the end position of the matched data is in a location that the filter allows a block to end at.

Output Encoding for Printer Centric Decompression

Figure 7:
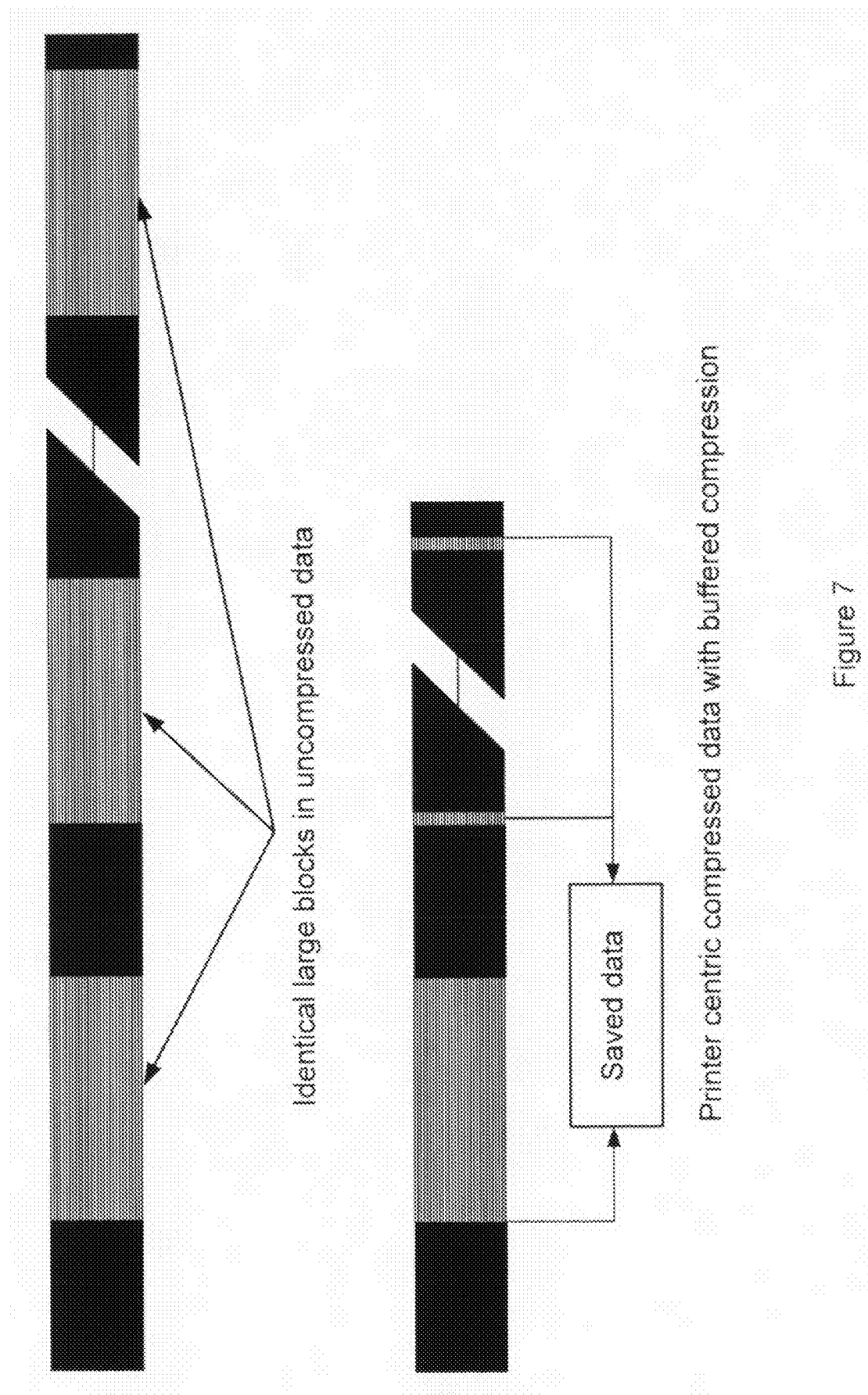
FIG. 7 shows the original data stream with identical large blocks in uncompressed data and the printer centric compressed data with buffered compression.

To define a sequence of data as reusable in a PDL one must generally precede the data with commands to setup storage of the data that follows. This differs from the default method used in the block compression algorithm, where the decompressing system is expected to buffer the decompressed output until decompression is complete (see FIG. 7).

One of two approaches can be used:
  the compressing system buffers the output to allow commands to be inserted in the output before sending the output to the printer;
  the compressing system inserts the commands and the reusable data in the output stream when it defines a new code word.

Figure 8:
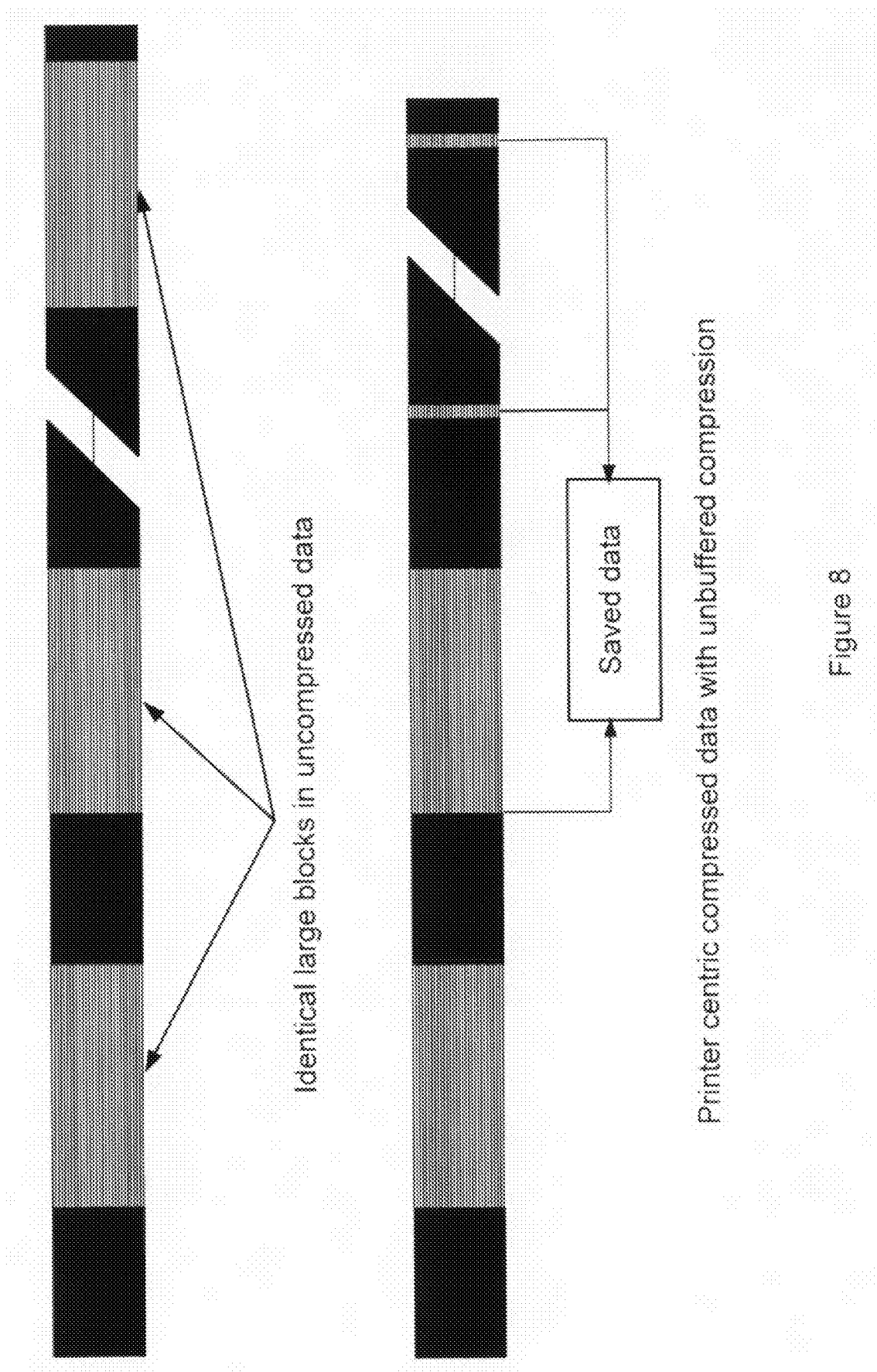
FIG. 8 shows the original data stream with identical large blocks in uncompressed data and the printer centric compressed data with unbuffered compression.

The second approach has the advantage of being able to send the output to the printer while compressing the output, but also has the disadvantage that the data that makes up a cached item is included twice in the output stream (see FIG. 8). The first approach generates the smallest output files but cannot send the compressed print stream to the printer until compression is complete.

A variant of the two approaches is also possible by limiting the amount of output buffering in the compression system to a large enough size. This may cause some reusable items to be defined using the first approach and some using the second approach depending on whether the part of the output stream that already contains the cacheable data is still in the output buffer or not.

Please note that for PDL's that support persisting cache items (such as PCL and PostScript printers with permanent storage devices), it is also possible to compress across multiple print streams as described earlier. The compressing system must then use device-specific methods or user-intervention to ensure that the cached items remain synchronized with the printer.

Depending on the PDL used the second level of compression as described in the block compression algorithm may or may not be possible. This depends on whether the PDL supports compression. For instance, PostScript printers do support various compression algorithms such as LZW and Flate and may therefore yield a better overall compression than for instance a PCL printer that does not.

What is claimed is:

1. A computer-implemented method for encoding a data stream, said method comprising the steps of:
(a) receiving said data stream;
(b) providing a 6 byte window for said data stream;
(c) examining the first three bytes of said window;
(d) determining if the first three bytes of said window has a corresponding entry in a lookup table;
(e) storing a position in the data stream of the first three bytes of said window in the lookup table if the lookup table does not include an entry corresponding to the first three bytes of said window;
(f) if the lookup table includes an entry corresponding to the first three bytes of said window, modifying the entry to include a binary tree of 6 byte sequences each beginning with the same three bytes and associating each 6 byte sequence included in the binary tree with a respective position in the data stream where the 6 byte sequence was found;
(g) if the lookup table already contains a binary tree of 6 byte sequences, determining if a 6 byte sequence currently in the window is present in the binary tree contained in the lookup table;
(h) if the 6 byte sequence currently in the window is not present in the binary tree contained in the lookup table, modifying the binary tree contained in the lookup table to associate the 6 byte sequence currently in the window with a current position in the data stream;
(i) if the 6 byte sequence currently in the window is present in the binary tree contained in the lookup table, determining a length of a matching portion by reading first data from a first location in the data stream at which the 6 byte sequence currently in the window was found and comparing the first data with second data following the 6 bytes currently in the window, and storing the length of the matching portion in the tree and assigning a codeword to the sequence of bytes in the matching portion;
(j) if the 6 byte sequence currently in the window already has an associated length and the length of the matching portion is greater than zero and less than the associated length, the length of a codeword assigned to the 6 byte sequence currently in the window is shortened in accordance with the length of the matching portion;
(h) continuing processing at a location in the data stream of a next non-matching byte until the data stream has been fully processed,
wherein the method is performed by a computer programmed to perform steps (a)-(h).

2. A method according to claim 1, wherein said data stream is a print stream.

3. A computer-implemented method for compressing a data stream based on three byte sequences, the method comprising:
assigning each three byte sequence a codeword with a location and a length of a data associated with the codeword; and
when a three byte sequence is located in the data stream,
building a binary tree of 6 byte sequences each beginning with the same three bytes,
associating each 6 byte sequence with a position in the data stream where the 6 byte sequence is found, so that when the length of a codeword word is changed, a byte sequence is emitted that identifies the code word being changed and the length of the codeword is updated, so that when a match is found, a byte sequence is emitted that identifies a codeword associated with the matched data,
wherein the method is performed by a computer programmed to perform the method.

4. A method according to claim 1, further comprising a step of further processing blocks of unmatched data by a dictionary coder adapted to find small repetitions of data.

* * * * *